(12) United States Patent
Yip

(10) Patent No.: US 7,282,395 B2
(45) Date of Patent: Oct. 16, 2007

(54) METHOD OF MAKING EXPOSED PAD BALL GRID ARRAY PACKAGE

(75) Inventor: Heng Keong Yip, Selangor Darul Ehsan (MY)

(73) Assignee: Freescale Semiconductor, Inc., Austin, TX (US)

( * ) Notice: Subject to any disclaimer, the term of this patent is extended or adjusted under 35 U.S.C. 154(b) by 182 days.

(21) Appl. No.: 11/297,103

(22) Filed: Dec. 7, 2005

(65) Prior Publication Data

US 2007/0128766 A1 Jun. 7, 2007

(51) Int. Cl.
*H01L 21/00* (2006.01)

(52) U.S. Cl. ............... 438/121; 438/124; 257/E21.511; 257/E21.512; 257/E21.516

(58) Field of Classification Search ........ 257/E21.511, 257/E21.516; 438/121, 124
See application file for complete search history.

(56) References Cited

U.S. PATENT DOCUMENTS 6,744,125 B2    6/2004  Carmenforte et al.
6,798,057 B2    9/2004  Bolkin et al.
6,940,154 B2*   9/2005  Pedron et al. ............. 257/666
7,154,166 B2*  12/2006  Ano ........................... 257/676
7,183,134 B2*   2/2007  Lee et al. .................. 438/106
2004/0084771 A1 5/2004  Bolken et al.
2005/0211465 A1* 9/2005  Sunohara et al. ........... 174/260

* cited by examiner

*Primary Examiner*—Trung Dang
(74) *Attorney, Agent, or Firm*—Charles Bergere

(57) ABSTRACT

A method of making an exposed-pad ball-grid array package (11) includes applying a conductive sheet (16) to an adhesive tape (18). Stamping the conductive sheet (16) to form a die pad (24) and separating the remainder (26) of the sheet from the adhesive tape (18) so that only the die pad (24) remains on the adhesive tape (18). A substrate (28) is applied to the adhesive tape (18) proximate to the die pad (24). A die (30) is attached to the die pad (24) and electrically coupled to the substrate (28). An encapsulant (34) is formed around at least a portion of the die (30), the die pad (24) and the substrate (28) above the adhesive tape (18). The adhesive tape (18) is removed from the die pad (24), substrate (28) and encapsulant (34). Conductive balls (36) are attached to the substrate (28).

20 Claims, 5 Drawing Sheets

METHOD OF MAKING EXPOSED PAD BALL GRID ARRAY PACKAGE

BACKGROUND OF THE INVENTION

The present invention relates to an exposed-pad Ball Grid Array (BGA) package, and more particularly, to a method of making an exposed-pad BGA package that includes die pad stamping.

A pin-grid array (PGA) and a ball-grid array (BGA) are types of microchip connection configurations that are known in the art. A PGA is a generally square chip package with a high density of pins enabling it to support a large number of input/output (I/O) from an associated microchip. The pins permit the microchip to connect to a socket or fit into solderable holes on a printed circuit board (PCB) or the like. The underside of a PGA package looks like a bed of nails. On the other hand, BGA microchips typically use a group of solder balls arranged in concentric rectangles to connect to a PCB. BGA packages often are used in applications where PGA packages would take up too much space due to the length and size of the package pins.

Referring to FIG. 1, a conventional BGA package 100 is shown. The BGA package 100 is a stacked die package that includes a first die 102 and a second die 104 attached to silicon or plastic interposer 105. The dies 102 and 104 are mechanically bonded to the interposer 105 by an epoxy or adhesive and are electrically interconnected to the interposer 105 by wires 108. The interposer 105 includes circuitry to provide electrical interconnects between the two dies 102 and 104 and to interface solder balls 110. The solder balls 110 provide electrical contacts to an external substrate, another package, test device, power source or the like. The BGA package 100 includes an encapsulant 112, which mechanically supports the package 100, allows thermal expansion and contraction, and prevents contaminants from coming into contact with the dies 102 and 104. A portion of each solder ball 110 is exposed and provides an external interface to the dies 102 and 104. The resulting overall BGA package 100 is stackable onto other BGA packages 100 or onto a PCB (not shown). Generally, the BGA package 100 is formed by coupling the semiconductor dies 102, 104 to each of the opposing faces of the interposer 105 in order to improve package space efficiency.

Another conventional BGA device 120 is shown in FIG. 2. The BGA device 120 includes a semiconductor substrate 122 such as a PCB, a flexible tape or the like. A semiconductor die 124 is mounted within the BGA device 120. Bonding pads on the surface of the semiconductor die 124 provide electrical access to the die 124. A layer 128 is applied over the surface of the substrate 122. The layer 128 may be a copper foil or an adhesive film such as a polyimide film. When the layer 128 is an adhesive film, the film is later removed and replaced with a copper foil. A mold compound 130 surrounds the die 124, bond wires 132 and a portion of the contact pads 134 of the substrate 122. Copper traces 136 are formed overlying a top surface 138 of the substrate 122. The copper traces 136 are in electrical contact with points of contact provided in the top surface 138 of the substrate 122. The bond wires 132 connect points of electrical contact in the surface of the die 124 with contact points 134 on a surface 140 of the substrate 122. The bond wires 132 are typically connected to the die 124 via ball bonds 126. Contact balls 142 are connected to contact pads 144 on the surface 140 of the substrate 122. A solder mask 146 overlays the surface 140 of the substrate 122. Openings in the solder mask 146 provide access to the contact pads 134 and 144. The contact pads 134 are for wire bond connections 132 with the die 124, and the contact pads 144 are for connections with an array of the contact balls 142.

As electronic devices become increasingly smaller and more portable, it is becoming more desirable to provide BGA devices that are thinner (i.e., have a reduced overall height or thickness) while maintaining ease and quality of manufacture. It is desirable to provide a relatively thin (BGA) type package that has a profile of less than about 0.8 millimeters (mm). It also is desirable to provide a method of forming a relatively thin exposed-pad BGA package.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
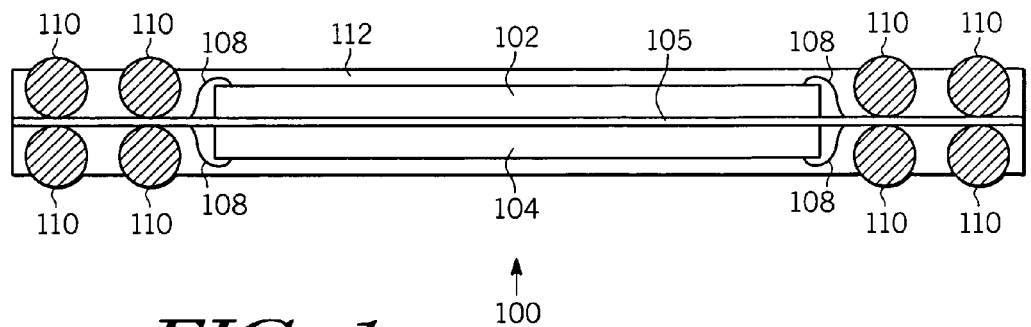
FIG. 1 is a side elevational view of a first conventional BGA device.
Figure 2:
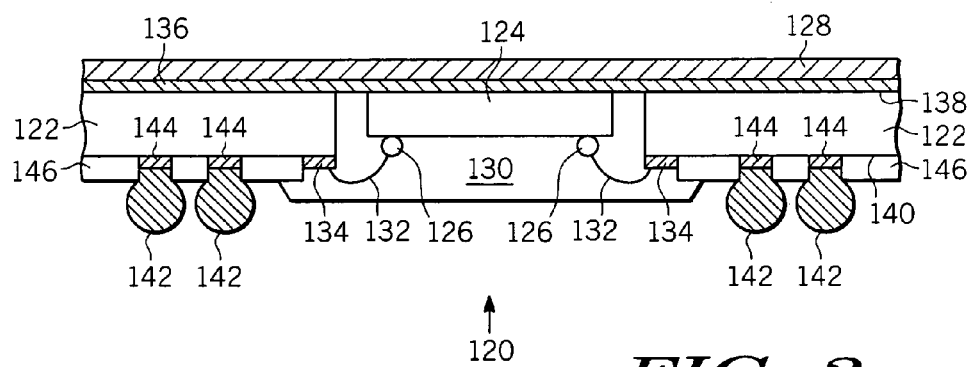
FIG. 2 is a side elevational view of a second conventional BGA device.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a," as used in the claims and in the corresponding portions of the specification means "at least one."

Briefly stated, the present invention is a method of making an exposed-pad BGA package that includes applying a conductive sheet to an adhesive tape. A portion of the conductive sheet is stamped and separated from the remainder of the sheet. The stamped portion of the sheet defines a die pad and the remainder of the conductive sheet is removed from the adhesive tape so that only the die pad remains on the adhesive tape. A substrate is applied to the adhesive tape near the die pad. A semiconductor die is attached to the die pad and electrically coupled to the substrate. An encapsulant is formed around at least a portion of the die, the die pad and the substrate above the adhesive tape. The adhesive tape is removed from the die pad, substrate and encapsulant, and conductive balls are attached to the substrate.

Referring to the drawings in detail, wherein like reference numerals indicate like elements throughout, there is shown in FIGS. 3 and 5-11 a method of making an exposed-pad ball-grid array (BGA) package 14 (FIG. 11) in accordance with a first preferred embodiment of the present invention.

Figure 3:
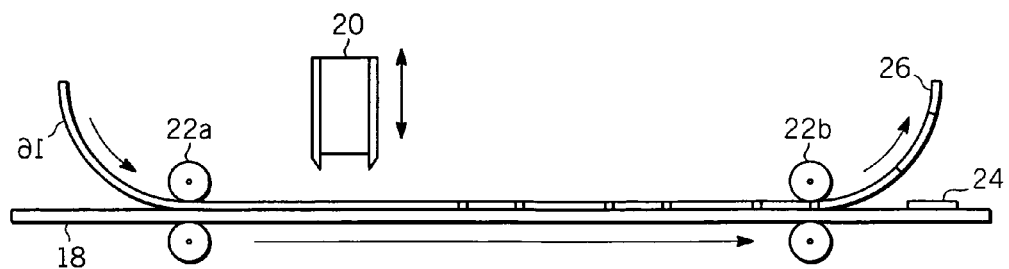
FIG. 3 is a side elevational view of a conductive sheet being applied to an adhesive tape and a stamping process to form die pads in accordance with a first preferred embodiment of the present invention.

FIG. 3 shows a conductive sheet 16 being applied to an adhesive tape 18. The adhesive tape 18 is of a type well known in the art such as polyimide tape and the like. The conductive sheet 16 may be copper (Cu) foil or copper foil plated with nickel (Ni) and/or palladium (Pd) or some other conductive material or materials known in the art. The conductive sheet 16 and adhesive tape 18 are semi-continuously fed under a die stamping device or die stamp 20 by feed rollers 22a, 22b. The conductive sheet 16 and the adhesive tape 18 may be fed from a semi-continuous roll of material, a stack of sheets of material, a film-stretcher, an extruder or the like. The conductive sheet 16 is applied to the tape 18 by the rollers 22a. Then a portion of the sheet 16 is stamped by the die stamp 20 to form a die pad 24. After the stamping, a remainder 26 of the sheet 16 is removed from the tape 18 (detaping) after exiting the rollers 22b.

As shown in the drawings, the die pad 24 is attached to the adhesive tape 18. The remainder 26 of the conductive sheet 16 is removed from the adhesive tape 18 so that only the die pad 24 remains on the adhesive tape 18. Preferably, a plurality of die pads 24 are stamped from the conductive sheet 16 at spaced intervals. The die stamp 20 may leave a rectangular, square, circular, oval, polygonal or other geometrically or non-geometrically-shaped stamped impression in the conductive sheet 16. The die stamp 20 may have sharpened stamping edges for severing the conductive sheet material 16. Further, various size stamps 20 can be used on the same conductive sheet to form die pads of varying sizes. This method has been found to be very cost effective and advantageous for forming various size die pads on a tape.

Figure 5:
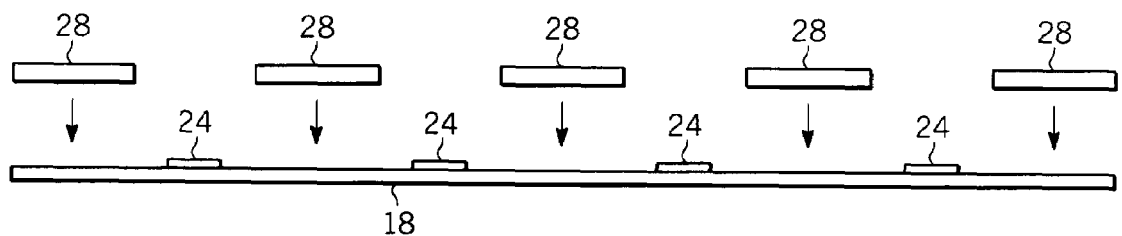
FIG. 5 is a side elevational view of a substrate being applied to the adhesive tape of FIG. 4.
Figure 6:
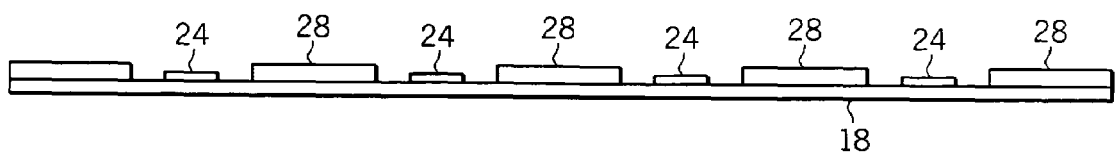
FIG. 6 is a side elevational view of the substrate of FIG. 5 attached to the adhesive tape.
Figure 7:
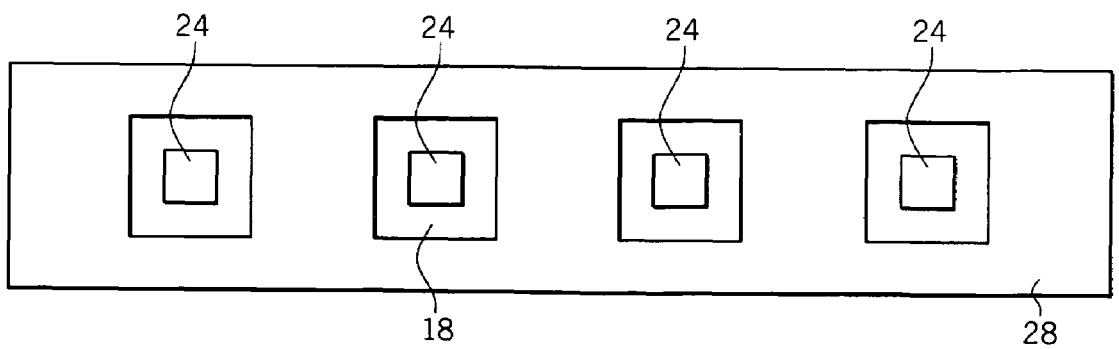
FIG. 7 is a top plan view of the substrate of FIG. 5 attached to the adhesive tape.

Referring to FIG. 5, a substrate 28 of a type known in the art is being applied to the adhesive tape 18 proximate to and generally surrounding but spaced apart from the die pads 24. FIGS. 6-7 show the substrate 28 attached to the adhesive tape 18. The substrate 28 includes conductive traces 40 (FIGS. 12-13) for interconnection.

Figure 8:
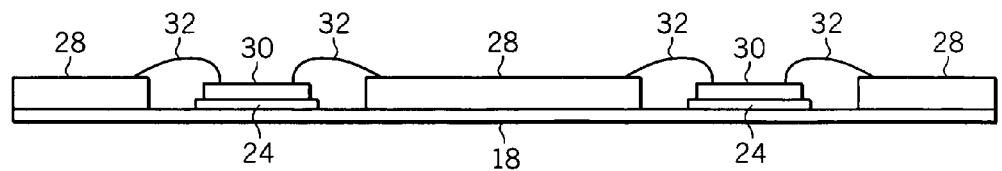
FIG. 8 is a side elevational view of semiconductor dies being attached to the die pads of FIG. 3 and the dies being electrically coupled to the substrate.

FIG. 8 shows a plurality of semiconductor dies 30 attached to the die pads 24. Each die 30 may be fabricated using any suitable semiconductor material or other non-conventional base materials upon which or within which electronic components may be formed. The dies 30 may be formed of, for example, silicon (Si), germanium (Ge), silicon germanium (SiGe), gallium arsenide (GaAs), indium arsenide (InAs), aluminium gallium arsenide, silicon carbide (SiC), diamond, sapphire or the like. The dies 30 also include various electronic components (not shown) formed in the semiconductor material, conductive paths and dielectrics for isolating the conductive paths as is known in the art. The dies 30 are fixed to the die pads 24 using an adhesive or die attach material such as a polymer adhesive, a polyimide adhesive, an epoxy, an eutectic alloy or the like. The die attach materials or adhesives may provide thermal and/or electrical conductivity between the dies 30 and the die pads 24.

The dies 30 are electrically coupled by wires 32 to the conductive traces 40 of the substrate 28. The wires 32 may be copper, gold, silver, aluminium or the like and wire-bonded to pads on the dies 30 and conductive traces 40 of the substrate 28. The conductive traces 40 of the substrate 28 permit external connection to the wires 32 which will be encapsulated or potted as described hereinafter. The conductive traces 40 provide vias and paths through and across the substrate 28. Optionally, additional electrical components, dielectrics and the like may be in contact with the conductive traces within or upon the substrate 28.

Figure 9:
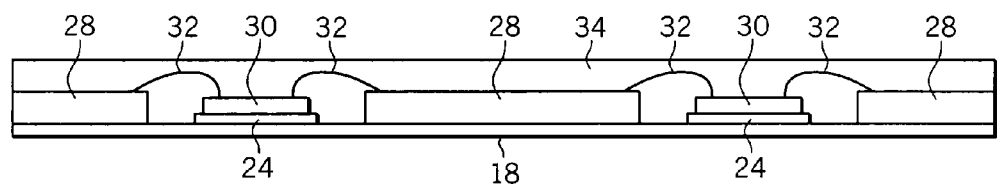
FIG. 9 is a side elevational view of a molding process being performed on a partially fabricated device of FIG. 8.

FIG. 9 shows a molding process being performed on the partially fabricated devices of FIG. 8. An encapsulant 34 such as an epoxy resin compound or other potting material, or simply epoxy 34, is molded around at least a portion of the dies 30, the die pads 24 and the substrate 28 above the adhesive tape 18. The sunken area between the substrate 28 and the dies 30 and die pads 24 forms a molded "cavity," which allows for resin formation with good package rigidity and low potential for "mold-cap" peeling (i.e., the top of the resin lifting after cure). Preferably, the encapsulant 34 exhibits high strength and low shrinkage during curing. The encapsulant 34 may require a curing additive and/or heating for curing to occur over a predetermined period of time. The encapsulant 34 is sufficiently cured and hardened so that the wires 32 and the connection points of the wires 32 to the dies 30 and substrate 28 are protectively embedded therein.

Figure 10:
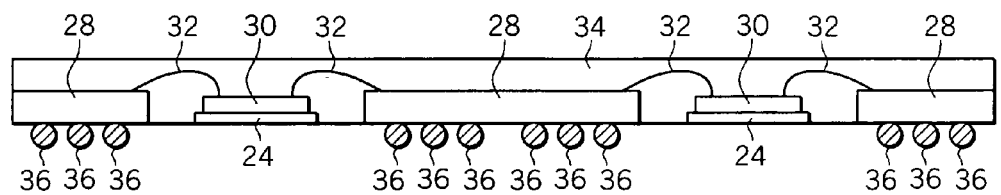
FIG. 10 is a side elevational view of the partially fabricated device of FIG. 9 after the adhesive tape has been removed and conductive balls have been affixed to the substrate.

As shown in FIG. 10, the adhesive tape 18 is removed from the die pads 24, substrate 28 and encapsulant 34. The removal of the adhesive tape 18 leaves an underside of the die pads 24 exposed and able to be soldered and/or electrically contacted. The adhesive tape 18 permits, during processing, handling of devices such as the dies 30, die pads 24 and substrate 28 without the need of a supporting base or package substrate, thereby enabling a relatively thin overall BGA package 14 (FIG. 11) to be formed.

A plurality of conductive balls 36 such as solder balls are attached to the conductive traces 40 of the substrate 28. The conductive balls 36 provide electrical connectivity from the dies 30 through the wires 32 to other external devices such as other exposed-pad BGA packages 14 (FIG. 12), PCBs 42 (FIG. 13), other external electrical/electronic devices or the like.

Figure 11:
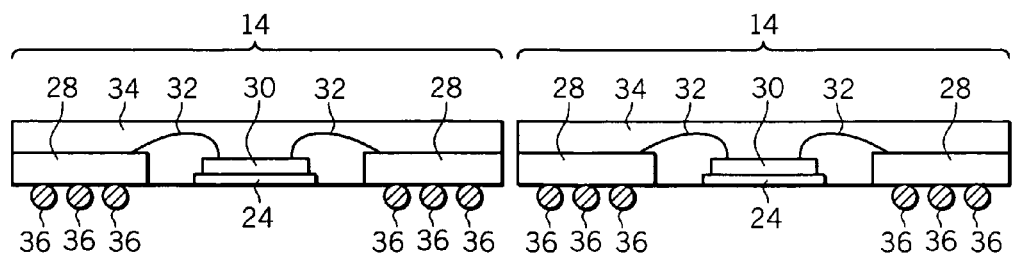
FIG. 11 is a side elevational view of a plurality of exposed-pad BGA packages in accordance with the first preferred embodiment of the present invention formed by dividing the partially formed device of FIG. 10.

FIG. 11 shows two exposed-pad BGA packages 14 in accordance with a first preferred embodiment of the present invention formed by dividing or singulating the partially formed device of FIG. 10. The dividing may be performed by chemical or mechanical sawing, punching, slicing or the like. Preferably, the process is semi-continuous or nearly continuous by roll or sheet feeding the adhesive tape 18 and conductive sheet 16 so that large numbers of exposed-pad BGA packages 14 are formed by the dividing process.

Figure 12:
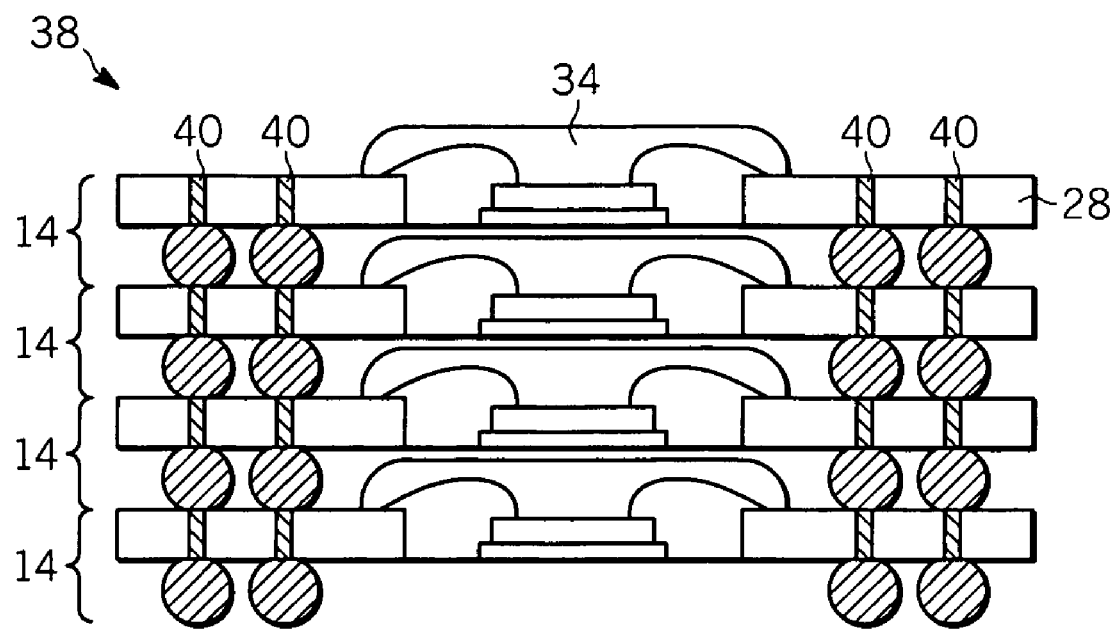
FIG. 12 is a side elevational view of a stack of exposed-pad BGA packages in accordance with a preferred embodiment of the present invention.

FIG. 12 shows a stack 38 of the exposed-pad BGA packages 14 in accordance with a preferred embodiment of the present invention. Portions of the encapsulant 34 over the substrate 28 may be removed by chemical or mechanical etching, grinding, polishing or the like, in order to expose the conductive traces 40 on an upper surface of the substrate 28. The conductive balls 36 of an overlaying exposed-pad BGA package 14 can be aligned with the exposed conductive traces 40 on the upper surface of the substrate 28 of an underlying exposed-pad BGA package 14 to form the stack 38 of exposed-pad BGA packages 14. The stack 38 of exposed-pad BGA packages 14 may be mounted on a PCB 44 (FIG. 13) or otherwise electrically and/or mechanically connected to other devices.

Figure 13:
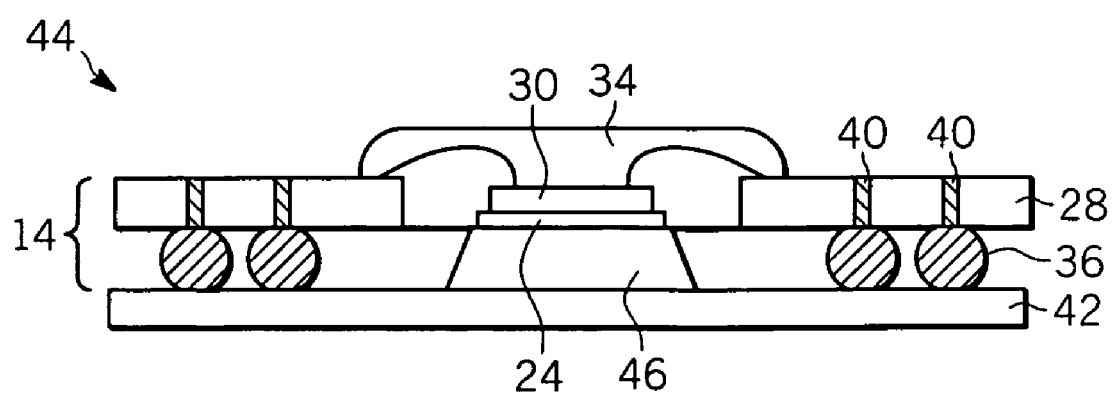
FIG. 13 is a side elevational view of an exposed-pad BGA package soldered to a printed circuit board in accordance with a preferred embodiment of the present invention.

FIG. 13 shows an exposed-pad BGA package 14 electrically and/or mechanically coupled to a printed circuit board (PCB) 42 to form a package on printed circuit board device 44 in accordance with a preferred embodiment of the present invention. Preferably, the die pad 24 is electrically and/or mechanically coupled to the PCB 42 by solder 46. The electrical and/or mechanical coupling of the die pad 24 to the PCB 42 provides for relatively high thermal dissipation from the die pad 24 while maintaining a relatively low profile of the overall exposed-pad BGA package 14 without the need for external cooling fins, heat sinks and the like. There is a nearly direct thermal dissipation path from the die 30 and die pad 24 to the PCB 42 as compared to an organic substrate having vias and a limited surface area for heat dissipation. The conductive balls 36 may be electrically coupled to the PCB 42 by soldering, paste, conductive potting, direct contact and the like, as is desired for electrical and/or mechanical connectivity.

Figure 4:
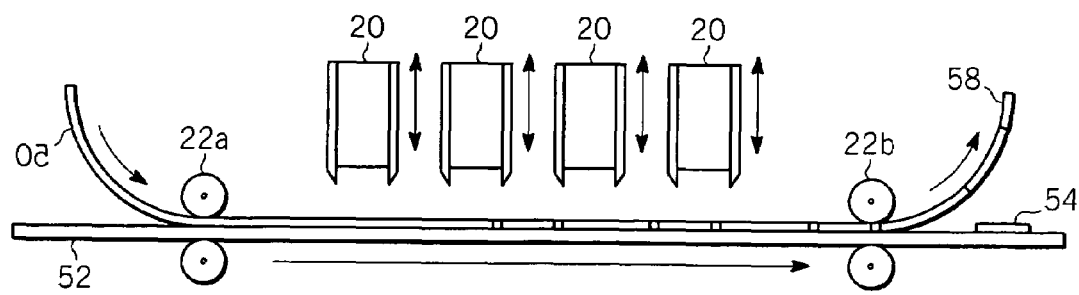
FIG. 4 is a side elevational view of a conductive sheet being applied to an adhesive tape and a stamping process to form lead frame lead fingers in accordance with a second preferred embodiment of the present invention.

Referring now to FIG. 4, a conductive sheet 50 being applied to an adhesive tape 52 and a stamping process using a plurality of die stamps 20 to form a plurality of lead frame lead fingers 54 is shown. The process of FIG. 4 is used to form an exposed-pad BGA package 48 (FIG. 14) in accordance with a second preferred embodiment of the present invention. The conductive sheet 50 and adhesive tape 52 may be fed through feed rollers 22a, 22b and the like. After the conductive sheet 50 is stamped using the plurality of die stamps 20, the remainder 58 of the conductive sheet 50 is removed from the adhesive tape 52 leaving the plurality of lead frame lead fingers 54, which form an array lead frame 64. In this embodiment, the semiconductor die 56 has a plurality of conductive bumps 60 formed on an underside thereof. The die 56 is placed on top of the array lead frame 64 such that respective ones of the bumps 60 rest on corresponding ones of the lead fingers 54 of the array lead frame 64. A reflow may be performed to secure the bumps 60 to the lead fingers 54.

Figure 14:
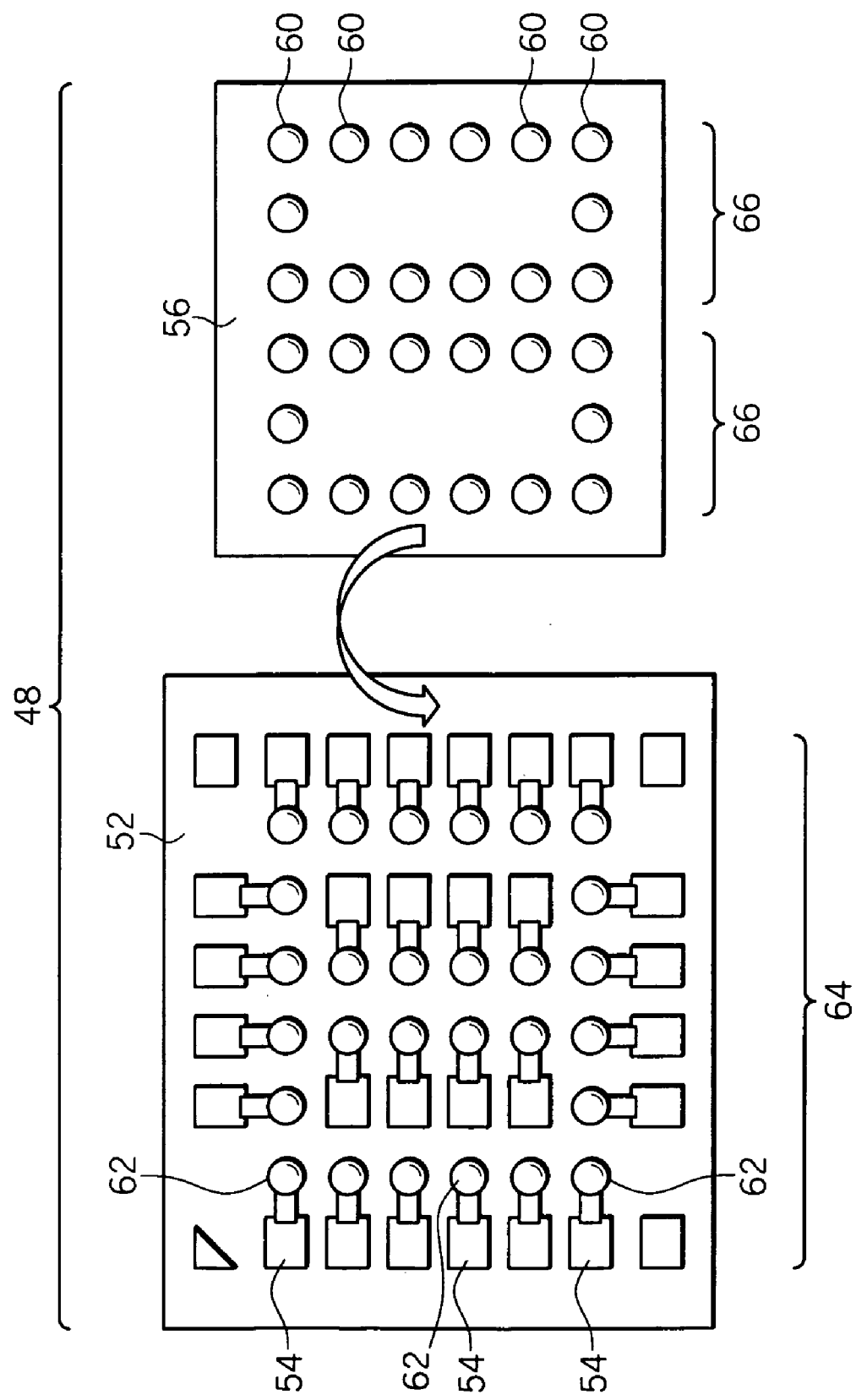
FIG. 14 is a top plan view of a bumped die being attached to an array lead frame on an adhesive tape in accordance with an embodiment of the present invention.

As an alternative, as shown in FIG. 14, the lead fingers 54 may each include a bump connector 62 for connection with the bumps 60 of the die 56 in which case the bump connectors 62 are arranged in a pattern or patterned array. As discussed above, the die 56 includes a pattern or patterned array 66 of bumps or connections 60 that corresponds to the patterned array 64 of lead fingers 54 on the adhesive tape 52, thereby permitting a plurality of connections from the die 56 to the plurality of lead fingers 54. The bumped die 56 having a plurality of bumps 60 is about to be attached to the patterned array 64. Mold encapsulation and tape removal will then occur in order to form an exposed-pad BGA package.

From the foregoing, it can be seen that the present invention is directed to methods for forming an exposed-pad ball-grid array (BGA) package including die stamping conductive sheets to form exposed die pads. Embodiments of the present invention are formed as die up devices with a solderable exposed die pad for thermal dissipation. In the preferred embodiments, the devices are formed by die stamping conductive foil using a polyimide adhesive tape as a removable handling support during the manufacturing process. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

The invention claimed is:

1. A method of making an exposed-pad ball-grid array (BGA) package comprising:
    applying a conductive sheet to an adhesive tape;
    forming a die pad from the conductive sheet by stamping a portion of the conductive sheet and removing a remainder of the conductive sheet, wherein the stamped portion of the conductive sheet defines the die pad;
    applying a substrate to the adhesive tape proximate to the die pad;
    attaching a semiconductor die to the die pad;
    electrically coupling the die to a top surface of the substrate;
    encapsulating at least a portion of the die, the die pad and the substrate with an encapsulant above the adhesive tape;
    removing the adhesive tape from the die pad, substrate and encapsulant; and
    attaching at least one conductive ball to a bottom surface of the substrate.

2. The method of making an exposed-pad BGA package according to claim 1, further comprising:
    forming a plurality of die pads in the stamping step;
    attaching a semiconductor die to each of the plurality of die pads; and
    dividing the substrate in order to form a plurality of BGA packages each having at least one die and die pad.

3. The method of making an exposed-pad BGA package according to claim 2, further comprising removing at least a portion of the encapsulant from an upper surface of the substrate.

4. The method of making an exposed-pad BGA package according to claim 3, further comprising stacking the exposed-pad BGA package on another exposed-pad BGA package so that the at least one conductive ball of the exposed-pad BGA package electrically contacts conductive traces of the substrate of the other exposed-pad BGA package.

5. The method of making an exposed-pad BGA package according to claim 2, wherein the conductive sheet and the adhesive tape are fed from one of a roll of material, a stack of sheets of material, a film-stretcher and an extruder.

6. The method of making an exposed-pad BGA package according to claim 2, wherein the dividing is performed by one of sawing, punching and slicing.

7. The method of making an exposed-pad BGA package according to claim 1, further comprising electrically coupling the die pad to a printed circuit board.

8. The method of making an exposed-pad BGA package according to claim 7, wherein the electrical coupling of the die pad to the printed circuit board includes soldering.

9. The method of making an exposed-pad BGA package according to claim 1, wherein the conductive sheet is one of copper foil, nickel-plated copper foil, palladium-plated copper foil and nickel-palladium-plated copper foil.

10. The method of making an exposed-pad BGA package according to claim 1, wherein adhesive tape is polyimide adhesive tape.

11. The method of making an exposed-pad BGA package according to claim 1, wherein the removal of the adhesive tape leaves an underside of the die pad exposed.

12. The method of making an exposed-pad BGA package according to claim 1, wherein the die stamping step includes using a plurality of die stamps to simultaneously form a plurality of die pads during stamping.

13. The method of making an exposed-pad BGA package according to claim 12, wherein various size die stamps are used to form die pads of varying size.

14. An exposed-pad ball-grid array (BGA) package formed in accordance with the method of claim 1.

15. A method of making an exposed-pad ball-grid array (BGA) package comprising:
   laminating a foil sheet to an adhesive tape;
   forming at least one die pad on the adhesive tape by stamping the laminated foil sheet;
   applying a substrate to the adhesive tape proximate to the die pad;
   attaching a semiconductor die to the die pad;
   electrically coupling the die to the substrate;
   encapsulating at least a portion of the die, the die pad and the substrate with an encapsulant above the adhesive tape;
   removing the adhesive tape from the die pad, substrate and encapsulant; and
   attaching at least one conductive ball to a bottom surface of the substrate.

16. The method of making an exposed-pad BGA package according to claim 15, wherein the conductive sheet is one of copper foil, nickel-plated copper foil, palladium-plated copper foil and nickel-palladium-plated copper foil.

17. The method of making an exposed-pad BGA package according to claim 16, wherein adhesive tape is polyimide adhesive tape.

18. The method of making an exposed-pad BGA package according to claim 15, wherein various size die pads are formed by the stamping step.

19. The method of making an exposed-pad BGA package according to claim 15, wherein the electrically coupling step comprises wirebonding.

20. The method of making an exposed-pad BGA package according to claim 15, further comprising:
   forming a plurality of die pads in the stamping step;
   attaching a semiconductor die to each of the plurality of die pads; and
   singulating the substrate in order to form a plurality of BGA packages each having at least one die and die pad.

* * * * *